(12) United States Patent
Saxler

(10) Patent No.: US 7,626,217 B2
(45) Date of Patent: Dec. 1, 2009

(54) COMPOSITE SUBSTRATES OF CONDUCTIVE AND INSULATING OR SEMI-INSULATING GROUP III-NITRIDES FOR GROUP III-NITRIDE DEVICES

(75) Inventor: Adam William Saxler, Durham, NC (US)

(73) Assignee: Cree, Inc., Durham, NC (US)

(*) Notice: Subject to any disclaimer, the term of this patent is extended or adjusted under 35 U.S.C. 154(b) by 332 days.

(21) Appl. No.: 11/103,127

(22) Filed: Apr. 11, 2005

(65) Prior Publication Data
US 2006/0226413 A1 Oct. 12, 2006

(51) Int. Cl.
*H01L 29/12* (2006.01)
*H01L 21/338* (2006.01)

(52) U.S. Cl. .................. 257/194; 438/167; 438/172; 438/779; 438/783; 257/E29.246; 257/E21.407

(58) Field of Classification Search .............. 117/952; 257/194, E21.399, E21.403, E21.407, E29.246; 438/779, 783, 167, 172
See application file for complete search history.

(56) References Cited

U.S. PATENT DOCUMENTS

| | | | |
|---|---|---|---|
| 4,424,525 A | 1/1984 | Mimura | |
| 4,471,366 A | 9/1984 | Delagebeaudeuf et al. | |
| 4,727,403 A | 2/1988 | Hida et al. | |
| 4,755,867 A | 7/1988 | Cheng | |
| 4,788,156 A | 11/1988 | Stoneham et al. | |
| 4,946,547 A | 8/1990 | Palmour et al. | |
| 5,053,348 A | 10/1991 | Mishra et al. | |
| 5,172,197 A | 12/1992 | Nguyen et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,296,395 A | 3/1994 | Khan et al. | |
| 5,298,445 A | 3/1994 | Asano | |
| RE34,861 E | 2/1995 | Davis et al. | |

(Continued)

FOREIGN PATENT DOCUMENTS

EP     0 334 006 A1    9/1989

(Continued)

OTHER PUBLICATIONS

Rawn et al., Lattice Parameters of Gallium Nitride at High Temperatures and Resulting Epitaxial MISFITs With Alumina and Silicon Carbide. JCPDS-International Centre for Diffraction Data 2000, Advances in X-ray Analysis, vol. 43, pp. 338-343.*

(Continued)

*Primary Examiner*—M. Wilczewski
(74) *Attorney, Agent, or Firm*—Myers Bigel Sibley & Sajovec

(57) ABSTRACT

Group III-Nitride semiconductor device structures and methods of fabricating Group III-Nitride structures are provided that include an electrically conductive Group III-Nitride substrate, such as a GaN substrate, and a semi-insulating or insulating Group III-Nitride epitaxial layer, such as a GaN epitaxial layer, on the electrically conductive Group III-Nitride substrate. The Group III-Nitride epitaxial layer has a lattice constant that is and a composition that may be substantially the same as a composition and a lattice constant of the Group III-Nitride substrate.

41 Claims, 1 Drawing Sheet

U.S. PATENT DOCUMENTS

| | | |
|---|---|---|
| 5,389,571 A | 2/1995 | Takeuchi et al. |
| 5,393,993 A | 2/1995 | Edmond et al. |
| 5,523,589 A | 6/1996 | Edmond et al. |
| 5,534,462 A | 7/1996 | Fiordalice et al. |
| 5,592,501 A | 1/1997 | Edmond et al. |
| 5,686,737 A | 11/1997 | Allen |
| 5,700,714 A | 12/1997 | Ogihara et al. |
| 5,701,019 A | 12/1997 | Matsumoto et al. |
| 5,705,827 A | 1/1998 | Baba et al. |
| 5,804,482 A | 9/1998 | Konstantinov et al. |
| 5,885,860 A | 3/1999 | Weitzel et al. |
| 5,946,547 A | 8/1999 | Kim et al. |
| 5,990,531 A | 11/1999 | Taskar et al. |
| 6,028,328 A | 2/2000 | Riechert et al. |
| 6,046,464 A | 4/2000 | Schetzina |
| 6,051,849 A | 4/2000 | Davis et al. |
| 6,064,082 A | 5/2000 | Kawai et al. |
| 6,086,673 A | 7/2000 | Molnar |
| 6,150,680 A | 11/2000 | Eastman et al. |
| 6,177,685 B1 | 1/2001 | Teraguchi et al. |
| 6,177,688 B1 | 1/2001 | Linthicum et al. |
| 6,218,680 B1 | 4/2001 | Carter, Jr. et al. |
| 6,255,198 B1 | 7/2001 | Linthicum et al. |
| 6,261,929 B1 | 7/2001 | Gehrke et al. |
| 6,316,793 B1 | 11/2001 | Sheppard et al. |
| 6,376,339 B2 | 4/2002 | Linthicum et al. |
| 6,380,108 B1 | 4/2002 | Linthicum et al. |
| 6,429,467 B1 | 8/2002 | Ando |
| 6,448,648 B1 | 9/2002 | Boos |
| 6,462,355 B1 | 10/2002 | Linthicum et al. |
| 6,486,042 B2 | 11/2002 | Gehrke et al. |
| 6,489,221 B2 | 12/2002 | Gehrke et al. |
| 6,492,669 B2 | 12/2002 | Nakayama et al. |
| 6,515,316 B1 | 2/2003 | Wojtowicz et al. |
| 6,521,514 B1 | 2/2003 | Gehrke et al. |
| 6,545,300 B2 | 4/2003 | Gehrke et al. |
| 6,548,333 B2 | 4/2003 | Smith |
| 6,570,192 B1 | 5/2003 | Davis et al. |
| 6,582,906 B1 | 6/2003 | Cao et al. |
| 6,582,986 B2 | 6/2003 | Kong et al. |
| 6,586,778 B2 | 7/2003 | Linthicum et al. |
| 6,586,781 B2 | 7/2003 | Wu et al. |
| 6,602,763 B2 | 8/2003 | Davis et al. |
| 6,602,764 B2 | 8/2003 | Linthicum et al. |
| 6,608,327 B1 | 8/2003 | Davis et al. |
| 6,621,148 B2 | 9/2003 | Linthicum et al. |
| 6,639,255 B2 | 10/2003 | Inoue et al. |
| 6,673,702 B2 * | 1/2004 | Orita et al. ............. 438/507 |
| 6,686,261 B2 | 2/2004 | Gehrke et al. |
| 6,706,114 B2 | 3/2004 | Mueller |
| 6,765,240 B2 | 7/2004 | Tischler et al. |
| 6,841,001 B2 | 1/2005 | Saxler |
| 6,849,882 B2 | 2/2005 | Chavarkar et al. |
| 2001/0015446 A1 | 8/2001 | Inoue et al. |
| 2001/0020700 A1 | 9/2001 | Inoue et al. |
| 2001/0023964 A1 | 9/2001 | Wu et al. |
| 2001/0040246 A1 | 11/2001 | Ishii |
| 2002/0008241 A1 | 1/2002 | Edmond et al. |
| 2002/0017696 A1 | 2/2002 | Nakayama et al. |
| 2002/0066908 A1 | 6/2002 | Smith |
| 2002/0079520 A1 | 6/2002 | Yoshida |
| 2002/0119610 A1 | 8/2002 | Nishii et al. |
| 2002/0167023 A1 | 11/2002 | Chavarkar et al. |
| 2003/0017683 A1 | 1/2003 | Emrick et al. |
| 2003/0020092 A1 | 1/2003 | Parikh et al. |
| 2003/0102482 A1 | 6/2003 | Saxler |
| 2003/0123829 A1 | 7/2003 | Taylor |
| 2003/0145784 A1 | 8/2003 | Thompson et al. |
| 2003/0157776 A1 | 8/2003 | Smith |
| 2003/0213975 A1 | 11/2003 | Hirose et al. |
| 2003/0235970 A1 * | 12/2003 | Hsu et al. ............. 438/478 |
| 2004/0004223 A1 | 1/2004 | Nagahama et al. |
| 2004/0021152 A1 | 2/2004 | Nguyen et al. |
| 2004/0029330 A1 | 2/2004 | Hussain et al. |
| 2004/0061129 A1 | 4/2004 | Saxler et al. |
| 2004/0241970 A1 | 12/2004 | Ring |
| 2006/0099781 A1 * | 5/2006 | Beaumont et al. ............. 438/509 |

FOREIGN PATENT DOCUMENTS

| | | |
|---|---|---|
| EP | 0 563 847 A2 | 10/1993 |
| EP | 1 492 158 A2 | 12/2004 |
| JP | 10-050982 | 2/1998 |
| JP | 11261053 | 9/1999 |
| JP | 2001230407 A | 8/2001 |
| JP | 2002016087 A | 1/2002 |
| JP | 2004-342810 | 12/2004 |
| WO | WO 93/23877 A1 | 11/1993 |
| WO | WO 01/57929 A1 | 8/2001 |
| WO | WO 03/049193 A1 | 6/2003 |
| WO | WO 2004/008495 | 1/2004 |
| WO | WO 2004/061923 A1 | 7/2004 |

OTHER PUBLICATIONS

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

Ando et al., "10-W/mm AlGaN-GaN HFET With a Field Modulating Plate," *IEEE Electron Device Letters*, 24(5), pp. 289-291 (May 2003).

Asbeck et al. "Piezoelectric charge densities in AlGaN/GaN HFETs," *Elecronics Letters*. vol. 33, No. 14, pp. 1230-1231 (1997).

Beaumont, B. et al., "Epitaxial Lateral Overgrowth of GaN," *Phys. Stat. Sol.* (b) 227, No. 1, pp. 1-43 (2001).

Ben-Yaacov et al., "AlGaN/GaN Current Aperture Vertical Electron Transistors with Regrown Channels," *Journal of Applied Physics*. vol. 95, No. 4, pp. 2073-2078 (2004).

Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Burm et al. "Recessed Gate GaN MODFETS," *Solid-State Electronics*. vol. 41, No. 2, pp. 247-250 (1997).

Burm et al. "Ultra-Low Resistive Ohmic Contacts on $n$-GaN Using Si Implantation," *Applied Physics Letters*. vol. 70, No. 4, 464-66 (1997).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chen et al. "Cl2 reactive ion etching for gate recessing of AlGaN/GaN field-effect transistors," *J. Vac. Sci. Technol. B*. vol. 17, No. 6, pp. 2755-2758 (1999).

Chini et al., "Power and Linearity Characteristics of Field-Plagted Recessed-Gate AlGaN-GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys.* 33:775-778 (1994).

Coffie et al., Unpassivated p-GaN/AlGaN/GaN HEMTs with 7.1 W/MMF at 10 GHz, *Electronic Letters online No. 20030872*, 39(19), (Sep. 18, 2003).

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices*. vol. 48, No. 3, pp. 479-485 (Mar. 2001).

Egawa et al. "Recessed gate ALGaN/GaN MODFET on Sapphire Grown by MOCVD," *Applied Physics Letters*. vol. 76, No. 1, pp. 121-123 (Jan. 2000).

Gaska et al. "Electron Transport in AlGaN/GaN Heterostructures Grown on 6H-SiC Substrates," *Applied Physics Letters*. vol. 72, No. 6, pp. 707-709 (Feb. 1998).

Gaska et al. "High-Temperature Performance of AlGaN/GaN HFET's on SiC Substrates," *IEEE Electron Device Letters*. vol. 18, No. 1, pp. 492-494 (Oct. 1997).

Gaska et al., "Self-Heating in High-Power AlGaN/GaN HFET's," *IEEE Electron Device Letters*, 19(3), pp. 89-91 (Mar. 1998).

Gelmont et al. "Monte Carlo simulation of electron transport in gallium nitride," *Journal of Applied Physics*. vol. 74, No. 3, pp. 1818-1821 (Aug. 1993).

Heikman et al., "Growth of Fe-Doped Semi-insulating GaN by Metalorganic Chemical Vapor Deposition," *Applied Physics Letters*. vol. 83, No. 1, pp. 439-441 (Jul. 2002).

Heikman, et al., "Mass Transport Regrowth of GaN for Ohmic Contacts to AlGaN/GaN," *Applied Physics Letters*. vol. 78, No. 19, pp. 2876.

Heikman et al. "Polarization Effects in AlGaN/GaN and GaN/AlGaN/GaN heterostructures," *Journal of Applied Physics*. vol. 93, No. 12, pp. 10114-10118 (Jun. 2003).

Heikman, Sten J., *MOCVD Growth Technologies for Applications in AlGaN/GaN High Electron Mobility Transistors*, Dissertation, University of California—Santa Barbara, Sep. 2002, 190 pages.

Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).

Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Karmalkar et al. "RESURF AlGaN/GaN HEMT for High Voltage Power Switching," *IEEE Electron Device Letters*. vol. 22, No. 8, pp. 373-375 (Aug. 2001).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kasahara et al., "Ka-ban 2.3W Power AlGaN/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Kästers et al., "Double-Heterojunction Lattice-Matched and Pseudomorphic InGaAs HEMT with ō-Doped InP Supply Layers and p-InP Barier Enhancement Layer Grown by LP-MOVPE," *IEEE Electron Device Letters*, 14(1), (Jan. 1993).

Kuzmik et al. "Annealing of Schottky contacts deposited on dry etched AlGaN/Gan," *Semiconductor Science and Technology*. vol. 17, No. 11 (Nov. 2002).

Manfra et al., "Electron Mobility Exceeding 160 000 $cm^2$ $N$ s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Neuburger et al. "Design of GaN-based Field Effect Transistor Structures based on Doping Screening of Polarization Fields," WA 1.5, $7^{th}$ Wide-Gandgap III-Nitride Workshop (Mar. 2002).

Parikh et al., "Development of Gallium Nitride Epitaxy and Associated Material-Device Correlation for RF, Microwave and MM-wave Applications," Cree, Inc. (35 slides).

Ping et al. "DC and Microwave Performance of High-Current AlGaN/GaN Heterostructure Field Effect Transistors Grown on p-Type SiC Substrates," *IEEE Electron Device Letters*. vol. 19, No. 2, pp. 54-56 (Feb. 1998).

Saxler et al., "III-Nitride Heterostructures on High-Purity Semi-Insulating 4H-SiC Substrates for High-Power RF Transistors," International Workshop on Nitride Semiconductors (Jul. 19, 2004).

Sheppard et al. "High Power Demonstration at 10 GHz with GaN/AlGaN HEMT Hybrid Amplifiers." Presented at the $58^{th}$ DRC, Denver, CO, Jun. 2000.

Sheppard et al. "Improved 10-GHz Operation of GaN/AlGaN HEMTs on Silicon Carbide," *Materials Science Forum*. vols. 338-342, pp. 1643-1646, (2000).

Shen et al., "High-Power Polarization-Engineered GaN/AlGaN/GaN HEMTs Without Surface Passivation," *IEEE Electronics Device Letters*. vol. 25, No. 1, pp. 7-9 (2004).

Shiojima et al., "Improved Carrier Confinement by a Buried p-Layer in the AlGaN/GaN HEMT Structure," *IEICE Trans. Electron.*, E83-C(12), (Dec. 2000).

Sriram et al. "RF Performance of AlGaN/GaN MODFET's on High Resistivity SiC Substrates," Presentation at Materials Research Society Fall Symposium, 1997.

Sriram at al. "SiC and GaN Wide Bandgap Microwave Power Transistors," *IEEE Sarnoff Symposium*, Pittsburgh, PA, Mar. 18, 1998.

Sullivan et al. "High-Power 10-GHz Operation of AlGaN HFET's on Insulating SiC," *IEEE Electron Device Letters*. vol. 19, No. 6, pp. 198-200 (Jun. 1998).

"Thick AIN template on SiC substrate—Novel semi insulating substrate for GaN-based devices," © 2003 by TDI, Inc., http://www.tdii.com/products/AIN_SiCT.html.

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled "Improved Dielectric Passivation for Semiconductor Devices," U.S. Appl. No. 10/851,507, filed May 22, 2004 (Cree Docket No. P0274).

United States Patent Application entitled "Nitride-Based Transistors and Methods of Fabrication Thereof Using Non-Etched Contact Recesses," U.S. Appl. No. 10/617,843, filed Jul. 11, 2003.

United States Patent Application entitled "Nitride-Based Transistors with a Protective Layer and a Low-Damage Recess and Methods of Fabrication Thereof," U.S. Appl. No. 10/758,871, filed Jan. 16, 2004.

United States Patent Application entitled "Co-Doping for Fermi Level Control in Semi-Insulating Group III Nitrides," U.S. Appl. No. 10/752,970, filed Jan. 7, 2004.

United States Patent Application entitled "Cap Layers and/or Passivation Layers for Nitride-Based Transistors, Transistor Structures and Methods of Fabricating the Same," U.S. Appl. No. 10/996,249, filed Nov. 23, 2004.

United States Patent Application entitled "Methods of Having Laterally Grown Active Region and Methods of Fabricating Same," U.S. Appl. No. 10/899,215, filed Jul. 26, 2004.

United States Patent Application entitled "Silicon Carbide on Diamond Substrates and Related Devices and Methods," U.S. Appl. No. 10/707,898, filed Jan. 22, 2004 (Cree Docket No. P0387).

United States Patent Application entitled "Nitride Heterojunction Transistors Having Charge-Transfer Induced Energy Barriers and Methods of Fabricating the Same," U.S. Appl. No. 10/772,882, filed Feb. 5, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "Semiconductor Devices Having A Hybrid Channel Layer Current Aperture Transistors and Methods of Fabricating Same" U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Binary Group III-Nitride Based High Electron Mobility Transistors and Methods of Fabricating Same," U.S. Appl. No. 11/118,675, filed Apr. 29, 2005.

United States Patent Application entitled "Thick Semi-Insulating or Insulating Epitaxial Gallium Nitride Layers and Devices Incorporating Same," U.S. Appl. No. 11/103,117, filed Apr. 11, 2005.

Vaudo et al., "GaN Boule Growth: A Pathway to GaN Wafers With Improved Material Quality," ATMI, Inc. (2003).

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc.

Wu et al., "3.5-Watt AlGaN/GaN HEMTs and Amplifiers at 35 GHz," Cree Santa Barbara Technology Center, Goleta, CA 93117.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al. "High Al-Content AlGaN/GaN MODFET's for Ultrahigh Performance," *IEEE Electron Device Letters*. vol. 19, No. 2, pp. 50-53 (Feb. 1998).

Wu et al., "Linearity Performance of GaN HEMTs With Field Plates," DRC 2004, Cree, Inc.

Wu et al., "Linearity Performance of GaN HEMTs With Field Plates," Cree Santa Barbara Technology Center, Goleta, CA 93117.

Xu et al., "Growth and Characteristics of Freestanding Gallium Nitride Substrates," ATMI, Inc. (2003).

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

International Search Report and the Written Opinion of the International Searching Authority corresponding to PCT/US2006/004352, mailed May 31, 2006.

* cited by examiner

COMPOSITE SUBSTRATES OF CONDUCTIVE AND INSULATING OR SEMI-INSULATING GROUP III-NITRIDES FOR GROUP III-NITRIDE DEVICES

FIELD OF THE INVENTION

The present invention relates to semiconductor devices and, more particularly, to Group III-Nitride semiconductor devices.

BACKGROUND

Materials such as silicon (Si) and gallium arsenide (GaAs) have found wide application in semiconductor devices for radio frequency (RF) applications. However, these, more familiar, semiconductor materials may not be well suited for higher power because of their relatively small bandgaps (e.g., 1.12 eV for Si and 1.42 for GaAs at room temperature) and/or relatively small breakdown voltages.

In light of the difficulties presented by Si and GaAs, interest in high power and/or high frequency applications and devices has turned to wide bandgap semiconductor materials such as silicon carbide (2.996 eV for alpha SiC at room temperature) and the Group III-Nitrides (e.g., 3.36 eV for GaN at room temperature). These materials, typically, have higher electric field breakdown strengths than gallium arsenide (GaN) and GaN typically has better electron transport properties than silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Unlike electrons in conventional bulk-doped devices, electrons in 2DEG may have higher mobilities due to reduced ion impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system can generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

Conventional Group III-nitride HEMTs have been fabricated using heteroepitaxial growth; for such a HEMT grown on SiC, sapphire, AlN or Si substrates, the strain may limit the epitaxial thickness and/or wafer diameter before wafer bow makes processing difficult. Furthermore, dislocation densities are typically greater than $10^8$ cm$^{-2}$ for wafers that are suitable for processing. Homoepitaxial growth of HEMTs on GaN substrates has typically focused on the use of semi-insulating GaN substrates. Conventional HEMTs on GaN have typically had only a thin GaN buffer to prevent poor morphology for on-axis GaN.

SUMMARY OF THE INVENTION

Some embodiments of the present invention provide Group III-Nitride semiconductor device structures and methods of fabricating Group III-Nitride structures, that include an electrically conductive Group III-Nitride substrate and a semi-insulating or insulating Group III-Nitride epitaxial layer on the electrically conductive Group III-Nitride substrate. The Group III-Nitride epitaxial layer has a lattice constant that is substantially the same as a lattice constant of the Group III-Nitride. In some embodiments, the electrically conductive Group III-Nitride substrate and the semi-insulating or insulating Group III-Nitride epitaxial layer have substantially the same composition.

In particular embodiments of the present invention, the Group III-Nitride epitaxial layer has a thickness of at least about 5 µm and, in some embodiments, has a thickness of at least about 10 µm. In further embodiments of the present invention, the Group III-Nitride epitaxial layer is directly on the Group III-Nitride substrate.

In still further embodiments of the present invention, the Group III-Nitride epitaxial layer has a resistivity of at least $10^5$ Ω-cm. The Group III-Nitride epitaxial layer may have an isolation voltage of at least about 50V and, in some embodiments, an isolation voltage of at least about 100V.

In additional embodiments of the present invention, the semiconductor device structure includes a Group III-Nitride high electron mobility transistor on the Group III-Nitride epitaxial layer.

In particular embodiments of the present invention, the Group III-Nitride epitaxial layer is doped with a deep level transition metal dopant. The Group III-Nitride epitaxial layer may, for example, be doped with Fe, Co, Mn, Cr, V and/or Ni. The concentration of the deep level transition metal dopant may be at least about $1 \times 10^{16}$ cm$^{-3}$.

Some embodiments of the present invention provide a GaN semiconductor device structure and methods of fabricating a GaN semiconductor device structure that includes an electrically conductive GaN substrate and an insulating or semi-insulating GaN based epitaxial layer on the GaN substrate. The GaN based epitaxial layer having a composition and lattice constant that are substantially the same as a composition and lattice constant of the GaN substrate.

In further embodiments of the present invention, the GaN based epitaxial layer has a thickness of at least about 5 µm and, in some embodiments, has a thickness of at least about 10 µm. The GaN based epitaxial layer may be directly on the GaN substrate.

In additional embodiments of the present invention, the GaN based epitaxial layer has a resistivity of at least $10^5$ Ω-cm. The GaN based epitaxial layer may have an isolation voltage of at least about 50V and, in some embodiments, an isolation voltage of at least about 100V.

In still further embodiments of the present invention, a Group III-Nitride high electron mobility transistor is provided on the GaN based epitaxial layer.

In additional embodiments of the present invention, the GaN based epitaxial layer is doped with a deep level transition metal dopant. The GaN based epitaxial layer may be doped with Fe, Co, Mn, Cr, V and/or Ni. The concentration of the deep level transition metal dopant may be at least about $1\times10^{16}$ cm$^{-3}$.

DETAILED DESCRIPTION OF EMBODIMENTS OF THE INVENTION

Figure 1:
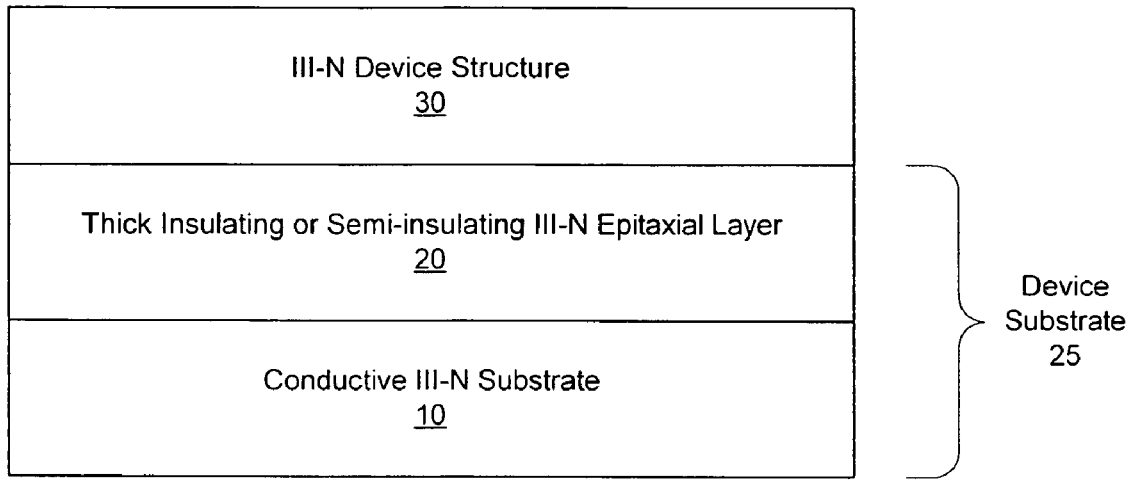
FIG. 1 is a cross-section of a composite substrate structure according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Embodiments of the present invention may be particularly well suited for use in nitride-based devices such as Group III-nitride based HEMTs. As used herein, the term "Group III-Nitride" refers to those semiconductor compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

As illustrated in FIG. 1, embodiments of the present invention provide a Group III-Nitride semi-insulating or insulating epitaxial layer 20 on a conductive Group III-Nitride substrate 10. The Group III-Nitride semi-insulating or insulating epitaxial layer 20 may have substantially the same composition as the Group III-Nitride substrate 10 and has substantially the same lattice constant as the Group III-Nitride substrate 10. The substrate 10 and the semi-insulating or insulating epitaxial layer 20 provide a device substrate 25 on which a Group III-N based device structure 30 is provided.

Figure 2:
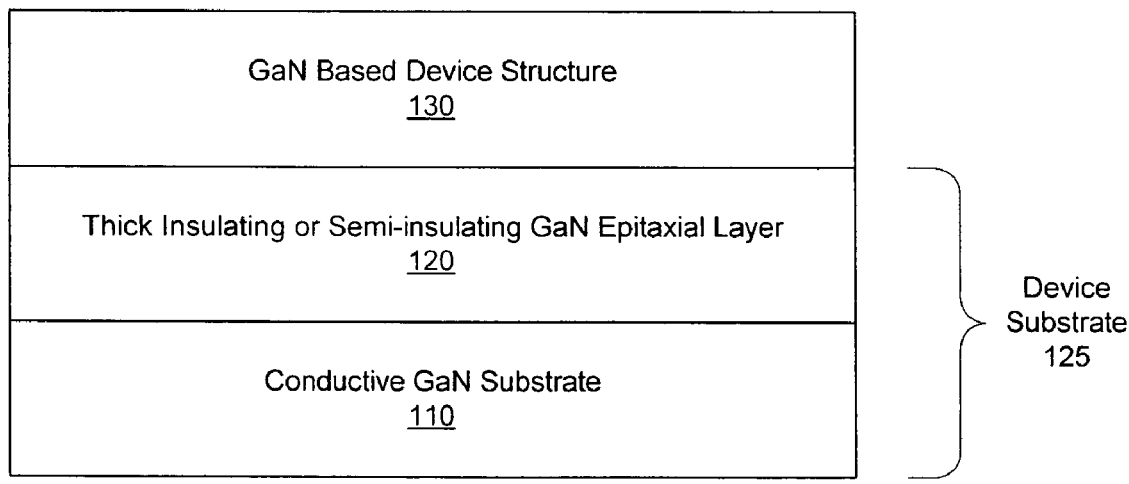
FIG. 2 is cross-section of a composite substrate structure according to further embodiments of the present invention.

FIG. 2 illustrates further embodiments of the present invention where a GaN semi-insulating or insulating epitaxial layer 120 is provided on a conductive GaN substrate 110. The GaN semi-insulating or insulating epitaxial layer 120 may have substantially the same composition as the GaN substrate 110 and has substantially the same lattice constant as the GaN substrate 110. The substrate 110 and the semi-insulating or insulating epitaxial layer 120 provide a device substrate 125 on which a GaN based device structure 130, such as a GaN based transistor structure, is provided.

The conductive substrates 10, 110 may be an n-type or p-type substrate. Reference to a Group III-Nitride substrate 10 and/or a GaN substrate 110 refers to a free-standing or boule grown substrate and may refer to Group III-Nitride and/or GaN layers with a substrate of another material which may be removed. Electrically conductive substrates may be easier and/or less expensive to produce in larger sizes and/or with higher structural quality than semi-insulating or insulating substrates. Methods of fabricating conductive Group III-Nitride and/or GaN substrates are known to those of skill in the art and need not be described further herein. For example, hydride vapor phase epitaxy (HVPE) may be used to grow single wafers or boules of Group III-Nitrides, such as GaN. See e.g., Xu et al., "Growth and Characteristics of Freestanding Gallium Nitride Substrates", ATMI, Inc., 2003; Vaudo et al., "GaN Boule Growth: A Pathway to GaN Wafers With Improved Material Quality," ATMI, Inc., 2003; and U.S. Pat. No. 6,765,240 entitled "BULK SINGLE CRYSTAL GALLIUM NITRIDE AND METHOD OF MAKING SAME," the disclosures of which are incorporated herein as if set forth in their entirety. Furthermore, conductive Group III-Nitride substrates, such as GaN substrates, are commercially available, for example, from Cree, Inc. of Durham, N.C. The substrate 10, 110 may be provided, for example, as a wafer having a 2 inch diameter, a 3 inch diameter or a diameter of 100 mm or greater.

The semi-insulating or insulating epitaxial layer 20, 120 may be formed on the substrate 10, 110 by techniques known to those of skill in the art. For example, metal organic vapor phase epitaxy (MOVPE) may be utilized. Suitable source materials for the semi-insulating or insulating epitaxial layer 20, 120 include, for example, trimethylgallium (TMGa), $NH_3$ and $Cp_2Fe$. The substrate 10, 110 may, for example, be slightly miscut from a face of the crystal of the substrate, which may improve surface morphology by providing more steps and, thereby, reduce impurity incorporation by providing a more smooth growth surface. For example, the substrate may be miscut from the (0001) face of a GaN substrate by a few degrees or less, such as 1 or 2 degrees. Because the semi-insulating or insulating epitaxial layer 20, 120 is formed by homo-epitaxial growth, it may be grown very thick compared to hetero-epitaxial films before wafer shape becomes an issue. Furthermore, because the substrate 10, 110 may be conducting it may provide a higher quality (e.g. reduced defect density) substrate for the semi-insulating or insulating epitaxial layer 20, 120. Additionally, homo-epitaxial growth of the semi-insulating or insulating epitaxial layer 20, 120 may also reduce the defects resulting from lattice mismatch that may be present in hetero-epitaxially formed layers.

The semi-insulating or insulating epitaxial layer 20, 120 may have deep level impurities, such as Fe, Co, Mn, Cr, V and/or Ni, and/or other point defects incorporated therein to make the epitaxial layer 20, 120 semi-insulating or insulating. In particular embodiments of the present invention, the GaN epitaxial layer 120 is doped with Fe. For example, in some embodiments of the present invention, a dopant concentration of $1\times10^{18}$ $cm^{-3}$ may be provided. Furthermore, additional dopants may also be incorporated in the epitaxial layer 20, 120. For example, if the composition of the epitaxial layer 20, 120 differs from that of the substrate 10, 110, polarization-induced charge may result from the compositional differences. Such polarization-induced charge may be counteracted by doping the epitaxial layer 20, 120 to maintain the insulating behavior of the epitaxial layer 20, 120. In particular embodiments of the present invention, the semi-insulating or insulating epitaxial layer 20, 120 may be doped as described in U.S. patent application Ser. No. 10/752,970, filed Jan. 7, 2004 and entitled "CO-DOPING FOR FERMI LEVEL CONTROL IN SEMI-INSULATING GROUP III NITRIDES," the disclosure of which is incorporated herein as if set forth in its entirety.

As used herein, the semi-insulating or insulating epitaxial layer 20, 120 has substantially the same composition as the substrate 10, 110 if the ratios of constituent elements in the semi-insulating or insulating epitaxial layer 20, 120 differ by less than 10% exclusive of doping of the semi-insulating or insulating epitaxial layer 20, 120. For example, if the substrate 10 is a conductive GaN substrate, such as the conductive GaN substrate 110, the semi-insulating or insulating epitaxial layer 20 would be considered to have substantially the same composition as the substrate 10 if the ratio of Ga to N in the semi-insulating or insulating epitaxial layer 20 was within 10% of the 1:1 ratio present in the substrate 10. Thus, the semi-insulating or insulating epitaxial layer 20 could, for example, be an $Al_xGa_{1-x}N$ layer as long as x was less than 0.1. Furthermore, the composition of the epitaxial layer 20, 120 could be non-uniform, such as graded, to compensate for the residual strain in the substrate 10, 110.

As used herein, the substrate 10, 110 and the semi-insulating or insulating epitaxial layer 20, 120 have substantially the same lattice constant if the lattice constant of the materials is within 0.3% of each other. The lattice constants that are compared are the unstrained lattice constants of the materials. As used herein, an unstrained lattice constant refers to the lattice constant of a material when the material is under less than approximately 1 GPa of stress. Thus, for example, even though the composition of the substrate 10, 110 and the semi-insulating or insulating epitaxial layer 20, 120 differ, they may still have the substantially the same lattice constant. Thus, for example, the substrate 10, 110 may be GaN and the semi-insulating or insulating epitaxial layer 20, 120 may be InAlGaN with the In and Al being provided so that the InAlGaN has substantially the same unstrained lattice constant as GaN.

In some embodiments, the composition and/or lattice constant of the substrate 10, 110 and the semi-insulating or insulating epitaxial layer 20, 120 exclusive of dopants are identical. The conductive substrate 10, 110 may have small amounts of residual strain as fabricated, for example, as a result of high levels of n-type doping. To compensate for this residual strain, the composition and/or lattice constant of the semi-insulating or insulating epitaxial layer 20, 120 may be adjusted to compensate for the strain, particularly, if the semi-insulating or insulating epitaxial layer 20, 120 is a thick layer, such as a layer having a thickness of greater than 5 µm or a thickness of a least 10 µm. For example, the composition of the epitaxial layer 20, 120, may be controlled to manage strain to maintain wafer flatness, e.g., avoid substantial wafer bowing. See, for example, U.S. Pat. No. 6,841,001, entitled "STRAIN COMPENSATED SEMICONDUCTOR STRUCTURES AND METHODS OF FABRICATING STRAIN COMPENSATED SEMICONDUCTOR STRUCTURES," the disclosure of which is incorporated herein as if set forth in its entirety.

In certain embodiments of the present invention, the semi-insulating or insulating epitaxial layer 20, 120 may be fabricated as follows. Suitable GaN layers may be deposited by MOCVD (e.g., MOVPE/OMCVD/OMVPE) using TMGa, $NH_3$, and $Cp_2Fe$ as precursors. Semi-insulating GaN has been deposited on multiple wafers up to 100 mm in diameter at the same time using a growth pressure of 0.2 bar, a temperature of 1000° C., a V/III ratio of 250, a growth rate of 6 μm/hr and a Fe doping density of $2\times10^{18}$ cm$^{-3}$.

As discussed above, the epitaxial layer 20, 120 is semi-insulating or insulating and the substrate 10, 110 is conductive. The terms "conductive," "semi-insulating" and "insulating" are understood by one of skill in the art and are used descriptively rather than in an absolute sense and, thus, are used to describe the relative conductivity/resistivity of the respective materials. In particular embodiments of the present invention, the semi-insulating or insulating epitaxial layer 20, 120 has a resistivity equal to or higher than about $1\times10^{5}$ Ω-cm at room temperature and the conductive substrate 10, 110 has a resistivity of equal to or less than about 0.01 Ω-cm at room temperature.

In some embodiments of the present invention, a conductive GaN substrate 110 may have a resistivity of less than about 0.1 Ω-cm for reduced or minimal resistance when used as the ground to which via metal through the semi-insulating or insulating GaN layer 120 is connected. Doping in the substrate 110 may be n-type at a level of greater than about $1\times10^{19}$ cm$^{-3}$.

In addition, because the substrate 10, 110 is conductive, the substrate 10, 110 may be used as a contact of the device structure 30, 130. Thus, for example, a via or vias through the epitaxial layer 20, 120 to the substrate 30, 130 may be provided as described, for example, in concurrently filed U.S. patent application Ser. No. 11/103,117, entitled "THICK SEMI-INSULATING OR INSULATING EPITAXIAL GALLIUM NITRIDE LAYERS AND DEVICES INCORPORATING SAME," the disclosure of which is incorporated herein by reference as if set forth in its entirety.

In some embodiments of the present invention, an even more heavily n-type doped layer, an n++ layer (not shown), may be epitaxially grown prior to, but preferably in the same run as, the semi-insulating layer 120 to act as an ohmic contact and/or current spreading layer. Thin epi layers may often be doped more heavily than thick substrates without significant defects in the crystal. In some embodiments, the n++ layer is grown as thick and as heavily doped as possible without introducing significant defects. A thicker n++ layer may better spread current with lower total resistance than the substrate alone. Furthermore, the thicker the n++ layer, the more easily low resistance ohmic contacts may be made to the n++ layer without requiring precise etch times. Small amounts of In many be incorporated to reduce the strain in heavily Si doped layers, reduce defects and allow more Si incorporation, and possibly serve as an indicator for when the etch should be stopped.

In additional embodiments of the present invention, multiple 2DEG structures (not shown) could be grown near the substrate to enhance current spreading at the expense of vertical resistance. In some embodiments, thin AlGaN layers could be heavily Si doped to increase the charge and reduce vertical resistance.

In some embodiments of the present invention, ion implantation of dopant into the substrate 10, 110 and annealing could also be used to help form ohmic contacts to the substrate 10, 110. Such ion implantation could be carried out before formation of the epitaxial layer 20, 120 or could be carried out using a via etch as a mask such that the implantation is performed in a window to the substrate 10, 110 opened by the via.

The epitaxial layer 20, 120 should be sufficiently insulating to provide electrical isolation of the device structure 30, 130 from the conductive substrate 10. In particular embodiments, the epitaxial layer 20, 120 should be sufficiently insulating to provide electrical isolation of a source region from a drain region of a transistor, such as a HEMT, when a gate of the transistor is biased to pinch off the channel. Thus, the high field characteristics of the epitaxial layer 20, 120 may, in some embodiments of the present invention, be more determinative than the resistivity of the epitaxial layer 20, 120. Such high field characteristics may be characterized by the isolation voltage of the structure. Thus, in some embodiments of the present invention, the epitaxial layer 20, 120 is sufficiently insulating to provide an isolation voltage of at least 50 V and, in further embodiments of the present invention, the epitaxial layer is sufficiently insulating to provide an isolation voltage of at least 100 V. The isolation voltage refers to the voltage that provides a 1 mA/mm current for an ungated transistor structure on the epitaxial layer 20, 120. Thus, for example, the isolation voltage of a structure may be measured by forming a HEMT structure on the epitaxial layer 20, 120 with a 5 μm source to drain spacing and removing the gate from the structure. A 3-μm region, centered between source and drain, is damaged, for example, by ion implantation, or the channel is etched away, for example, by reactive ion etching (RIE), to destroy the channel region of the device. A voltage is then applied from the source to the drain and the current measured. The voltage at which 1 mA per mm of width of current flow is measured is referred to herein as the isolation voltage of the structure.

The thickness of the semi-insulating or insulating epitaxial layer 20, 120 may depend on the device that is formed on the semi-insulating or insulating epitaxial layer 20, 120 and the expected operating conditions for the device. For example, for a HEMT structure with an expected operating frequency of 2 GHz, a thickness of 5 μm may be suitable. For a HEMT structure with an expected operating frequency of 10 GHz, a thickness of 10 μm may be suitable. The particular thickness of the semi-insulating or insulating epitaxial layer 20, 120 may be controlled by the acceptable capacitance between the active device region and the underlying conductive substrate.

While some embodiments of the present invention are not limited to a particular Group III-Nitride semiconductor device structure 30, in some embodiments of the present invention, the Group III-Nitride semiconductor device structure 30 may be a GaN based device structure 130, such as a GaN based transistor structure, as illustrated in FIG. 2. For example, the Group III-Nitride semiconductor device structure 30 or the GaN based device structure 130 may comprise a high electron mobility transistor (HEMT) structure. For example, some embodiments of the present invention may include transistor structures such as those described in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. Pat. No. 6,849,882 to Smorchkova et al., entitled "GROUP-III NITRIDE BASED HIGH ELECTRON MOBILITY TRANSISTOR (HEMT) WITH BARRIER/SPACER LAYER", U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," U.S. patent application Ser. No. 10/772,882 filed Feb. 5, 2004 for "NITRIDE HETEROJUNCTION TRANSISTORS HAVING CHARGE-TRANSFER INDUCED ENERGY BARRIERS AND METHODS OF FABRICATING THE SAME," U.S. patent application Ser. No. 10/897,726, filed Jul. 23, 2004 entitled "METHODS OF FABRICATING NITRIDE-BASED TRANSISTORS WITH A CAP LAYER AND A RECESSED GATE," U.S. patent application Ser. No. 10/849,617, filed May 20, 2004 entitled "METHODS OF FABRICATING NITRIDE-BASED TRANSISTORS HAVING REGROWN OHMIC CONTACT REGIONS AND NITRIDE-BASED TRANSISTORS HAVING REGROWN OHMIC CONTACT REGIONS," U.S. patent application Ser. No. 10/849,589, filed May 20, 2004 and entitled "SEMICONDUCTOR DEVICES HAVING A HYBRID CHANNEL LAYER, CURRENT APERTURE TRANSISTORS AND METHODS OF FABRICATING SAME," U.S. Patent Publication No. 2003/0020092 filed Jul. 23, 2002 and published Jan. 30, 2003 for "INSULATING GATE ALGAN/GAN HEMT", and U.S. patent application Ser. No. 10/996,249, filed Nov. 23, 2004 and entitled "CAP LAYERS AND/OR PASSIVATION LAYERS FOR NITRIDE-BASED TRANSISTORS, TRANSISTOR STRUCTURES AND METHODS OF FABRICATING SAME," the disclosures of which are incorporated herein as if described in their entirety. Embodiments of the present invention may also be utilized with HEMT structures such as described in, for example, Yu et al., "Schottky barrier engineering in III-V nitrides via the piezoelectric effect," Applied Physics Letters, Vol. 73, No. 13, 1998, or in U.S. Pat. No. 6,584,333 filed Jul. 12, 2001, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A Group III-Nitride High Electron Mobility Transistor (HEMT), comprising:
    an electrically conductive Group III-Nitride substrate;
    a semi-insulating or insulating Group III-Nitride epitaxial layer on the electrically conductive Group III-Nitride substrate, the Group III-Nitride epitaxial layer having a lattice constant that is substantially the same as a lattice constant of the Group III-Nitride substrate, wherein the Group III-Nitride epitaxial layer has an isolation voltage of at least about 50V; and a HEMT device structure on the semi-insulating or insulating GROUP III-Nitride epitaxial layer.

2. The HEMT of claim 1, wherein the electrically conductive Group III-Nitride substrate and the semi-insulating or insulating Group III-Nitride epitaxial layer have substantially the same composition.

3. The HEMT of claim 2, wherein the Group III-Nitride epitaxial layer has a thickness of at least about 5 µm.

4. The HEMT of claim 2, wherein the Group III-Nitride epitaxial layer has a thickness of at least about 10 µm.

5. The HEMT of claim 2, wherein the Group III-Nitride epitaxial layer is directly on the Group III-Nitride substrate.

6. The HEMT of claim 2, wherein the Group III-Nitride epitaxial layer has a resistivity of at least $10^5$ Ω-cm.

7. The HEMT of claim 2, wherein the Group III-Nitride epitaxial layer has an isolation voltage of at least about 100V.

8. The HEMT of claim 2, wherein the Group III-Nitride epitaxial layer is doped with a deep level transition metal dopant.

9. The HEMT of claim 8, wherein the Group III-Nitride epitaxial layer is doped with Fe, Co, Mn, Cr, V and/or Ni.

10. The HEMT of claim 2, wherein the concentration of the deep level transition metal dopant is at least about $1 \times 10^{16}$ cm$^{-3}$.

11. A GaN High Electron Mobility Transistor (HEMT), comprising:
    an electrically conductive GaN substrate;
    an insulating or semi-insulating GaN based epitaxial layer on the GaN substrate, the GaN based epitaxial layer having a composition and lattice constant that are substantially the same as a composition and lattice constant of the GaN substrate, wherein the GaN based epitaxial layer has an isolation voltage of at least about 50V; and a HEMT device structure on the insulating or semi-insulating GaN based epitaxial layer.

12. The HEMT of claim 11, wherein the GaN based epitaxial layer has a thickness of at least about 5 µm.

13. The HEMT of claim 11, wherein the GaN based epitaxial layer has a thickness of about least 10 µm.

14. The HEMT of claim 11, wherein the GaN based epitaxial layer is directly on the GaN substrate.

15. The HEMT of claim 11, wherein the GaN based epitaxial layer has a resistivity of at least $10^5$ Ω-cm.

16. The HEMT of claim 11, wherein the GaN based epitaxial layer has an isolation voltage of at least about 100V.

17. The HEMT of claim 11, wherein the GaN based epitaxial layer is doped with a deep level transition metal dopant.

18. The HEMT of claim 17, wherein the GaN based epitaxial layer is doped with Fe, Co, Mn, Cr, V and/or Ni.

19. The HEMT of claim 17, wherein the concentration of the deep level transition metal dopant is at least about $1 \times 10^{16}$ cm$^{-3}$.

20. A method of fabricating a Group III-Nitride High Electron Mobility Transistor (HEMT), comprising:
    epitaxially forming a semi-insulating or insulating Group III-Nitride epitaxial layer on an electrically conductive Group III-Nitride substrate, the Group III-Nitride epitaxial layer having a lattice constant that is substantially the same as a lattice constant of the Group III-Nitride substrate, wherein the GaN based epitaxial layer has an isolation voltage from at least about 50V to at least about 100V; and forming a HEMT device structure on the semi-insulating or insulating Group III-Nitride epitaxial layer.

21. The method of claim 20, wherein the electrically conductive Group III-Nitride substrate and the semi-insulating or insulating Group III-Nitride epitaxial layer have substantially the same composition.

22. The method of claim 21, wherein the Group III-Nitride epitaxial layer has a thickness of at least about 5 µm.

23. The method of claim 21, wherein the Group III-Nitride epitaxial layer has a thickness of at least about 10 µm.

24. The method of claim 21, wherein the Group III-Nitride epitaxial layer is directly on the Group III-Nitride substrate.

25. The method of claim 21, wherein the Group III-Nitride epitaxial layer has a resistivity of at least $10^5$ Ω-cm.

26. The method of claim 21, wherein the Group III-Nitride epitaxial layer has an isolation voltage of at least about 50V.

27. The method of claim 21, wherein the Group III-Nitride epitaxial layer has an isolation voltage of at least about 100V.

28. The method of claim 21, wherein the Group III-Nitride epitaxial layer is doped with a deep level transition metal dopant.

29. The method of claim 28, wherein the Group III-Nitride epitaxial layer is doped with Fe, Co, Mn, Cr, V and/or Ni.

30. The method of claim 28, wherein the concentration of the deep level transition metal dopant is at least about $1\times10^{16}$ cm$^{-3}$.

31. A method of fabricating a GaN High Electron Mobility Transistor (HEMT), comprising:
epitaxially forming an insulating or semi-insulating GaN based epitaxial layer on an electrically conductive GaN substrate, the GaN based epitaxial layer having a composition and lattice constant that are substantially the same as a composition and lattice constant of the GaN substrate, wherein the GaN based epitaxial layer has an isolation voltage from at least about 50V to at least about 100V; and forming a HEMT device structure on the insulating or semi-insulating GaN based epitaxial layer.

32. The method of claim 31, wherein the GaN based epitaxial layer has a thickness of at least about 5 μm.

33. The method of claim 31, wherein the GaN based epitaxial layer has a thickness of at least about 10 μm.

34. The method of claim 31, wherein the GaN based epitaxial layer is directly on the GaN substrate.

35. The method of claim 31, wherein the GaN based epitaxial layer has a resistivity of at least $10^5$ Ω-cm.

36. The method of claim 31, wherein the GaN based epitaxial layer has an isolation voltage of at least about 50V.

37. The method of claim 31, wherein the GaN based epitaxial layer has an isolation voltage of at least about 100V.

38. The method of claim 31, further comprising a Group III-Nitride high electron mobility transistor on the GaN based epitaxial layer.

39. The method of claim 31, wherein the GaN based epitaxial layer is doped with a deep level transition metal dopant.

40. The method of claim 39, wherein the GaN based epitaxial layer is doped with Fe, Co, Mn, Cr, V and/or Ni.

41. The method of claim 39, wherein the concentration of the deep level transition metal dopant is at least about $1\times10^{16}$ cm$^{-3}$.

* * * * *